(12) United States Patent
Fournel et al.

(10) Patent No.: US 6,225,679 B1
(45) Date of Patent: May 1, 2001

(54) METHOD AND APPARATUS FOR PROTECTING A DEVICE AGAINST VOLTAGE SURGES

(75) Inventors: Richard Fournel, Lumbin; Fabrice Marinet, Grenoble, both of (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/363,231

(22) Filed: Jul. 21, 1999

Related U.S. Application Data

(62) Division of application No. 08/854,840, filed on May 12, 1997.

(51) Int. Cl.[7] ............ H01L 29/00; H01L 27/082; H01L 27/102; H01L 29/70; H01L 31/11
(52) U.S. Cl. ............ 257/575; 257/554; 257/556; 257/557; 257/560; 257/561; 257/563; 257/576; 257/577
(58) Field of Search .......................... 257/554, 556, 257/557, 560, 561, 563, 575, 576, 577

(56) References Cited

U.S. PATENT DOCUMENTS

| | | | |
|---|---|---|---|
| 4,510,676 | * 4/1985 | Anantha et al. | 257/575 |
| 4,939,616 | 7/1990 | Roundtree | 257/173 |
| 4,978,628 | 12/1990 | Rosenthal | 438/220 |
| 4,987,465 | 1/1991 | Longcor et al. | 357/23.13 |
| 5,016,078 | 5/1991 | Tailliet | 357/42 |
| 5,072,273 | 12/1991 | Avery | 257/173 |
| 5,182,220 | 1/1993 | Ker et al. | 438/128 |
| 5,369,041 | 11/1994 | Duvvury | 437/6 |
| 5,422,841 | 6/1995 | Nakayama | 257/591 |
| 5,453,384 | 9/1995 | Chatterjee | 438/135 |
| 5,607,867 | 3/1997 | Amerasekera et al. | 438/334 |
| 5,804,477 | 9/1998 | Lien | 438/210 |

FOREIGN PATENT DOCUMENTS

| | | | |
|---|---|---|---|
| 0 680 090 | 11/1995 | (EP) | H01L/27/02 |
| WO90 15442 | 12/1990 | (WO) | H01L/27/04 |

OTHER PUBLICATIONS

1995 Symposium on VLSI Technology, Digest of Technical Papers, Kyoto, Jun. 6–8, 1995, Institute Of Electrical and Electronics Engineers, pp 85–86, Sharma U., et al., "An ESD Protection Scheme For Deep Sub–Micron ULSI Circuits".

\* cited by examiner

*Primary Examiner*—Eddie C. Lee
*Assistant Examiner*—Jesse A Fenty
(74) *Attorney, Agent, or Firm*—Wolf, Greenfield & Sacks, P.C.; James H. Morris; Theodore E. Galanthay

(57) ABSTRACT

A structure for the protection of a high-voltage pad includes a lateral bipolar transistor, an N-type diffusion of which, connected to the pad to be protected, is made in an N-type tub with a zone that extends laterally outside the tub in the base. A P-type implantation is made on the entire substrate outside the N-type tub except in the region in which the zone extends.

8 Claims, 4 Drawing Sheets

METHOD AND APPARATUS FOR PROTECTING A DEVICE AGAINST VOLTAGE SURGES

CROSS REFERENCE TO RELATED APPLICATIONS

This application is a division of application Ser. No. 08/854,840, filed May 12, 1997, entitled METHOD AND APPARATUS FOR PROTECTING A DEVICE AGAINST VOLTAGE SURGES, which prior application is incorporated herein by reference.

BACKGROUND OF THE INVENTION

1. Field of the Invention

The invention relates to a method and apparatus for protecting a circuit connection pad against electrostatic voltage surges.

2. Discussion of the Related Art

The problem of protecting an integrated circuit against surge voltages and electrostatic discharges is well known. It is desirable to prevent destruction or deterioration of elements of internal circuitry of the integrated circuit. For this purpose, protection devices are used to dissipate the energy. These devices are designed to become activated from a certain voltage level upwards and are capable of conducting high current.

A well-known protection device comprises a series protection resistor Rp coupled between a connection pad PS, an input or output pad, of the integrated circuit and an input or output terminal B1 of internal circuitry to be protected. A lateral bipolar transistor Tb is connected between this connection pad PS and ground, a base of which is also connected to ground as shown in FIG. 1.

A standard structure of an NPN bipolar transistor on a P-type substrate comprises two N type diffusions, one corresponding to the emitter and the other to the collector. The base corresponds to a substrate zone between the emitter and the collector. The substrate is biased to ground by a resistive P+ substrate connector. The two diffusions are insulated by a field oxide layer beneath which, conventionally, there is the field, implantation, referenced Piso, i.e., a P-type zone with higher doping than the substrate. The breakdown voltage of a device of this kind depends on the doping of the N type diffusion and the doping of the field implantation Piso. In known CMOS technologies, which include making an implantation of the same type as the substrate made on the entire substrate except in regions of opposite type tubs (these are the technologies known as twin-tub technologies) to prevent the tubs from widening excessively, there will then be a breakdown voltage on the order of 12 to 15 volts.

As soon as the voltage at the connection pad PS reaches or goes beyond this level, the well-known process of protection will be activated, as shown in FIGS. 2a and 2b, with a conduction by collector-base breakdown or disruption followed by a passage of the collector-emitter into forward bias. The following occurs:

(1) The collector-base junction (if it is the collector that is connected to the pad) breaks down, causing a current ib to flow in the base.

(2) Since the base is resistive, the base-emitter voltage Vbe increases with the current ib until it reaches 0.6 volts.

(3) The base-emitter voltage Vbe, upon reaching 0.6 volts, forward biases the base-emitter junction, which then lets through a high current (bipolar conduction).

The protection resistor Rp, for its part, enables the limiting of the current in the logic circuitry that is to be protected.

There is also a known improved lateral bipolar transistor structure that can be used to protect the circuit for far higher breakdown voltage levels, e.g., in the range of 40 to 100 volts. This is obtained by placing the N type diffusion of the collector, if it is the collector that is connected to the pad to be protected, entirely in an N type tub. It should be noted that a tub corresponds to an implantation of impurities at a greater depth but with a lower concentration than the diffusion which is a surface diffusion. In one example, the N type tub has a depth of 2.2 microns with a doping of $8 \times 10^{12}$ atoms/cm$^3$, and the diffusion has a thickness of 0.15 microns with a doping of $5 \times 10^{15}$ atoms/cm$^3$. A junction between the N type tub and the P-type substrate therefore has a breakdown voltage that is far higher than the junction between the N type diffusion and the P-type substrate, since the tub is far less doped.

In certain integrated circuits, however, connection pads are designed for transmission at input or at output of high voltage levels, for example, in the range of 20 volts. If it is sought to protect these connection pads, it is necessary first of all to enable the transmission of the desired level of high voltage without activating the protection. It can be seen that it is not possible to use the standard lateral bipolar transistor structure since a breakdown voltage of 12 to 15 volts is obviously far too low. However, the modified structure of the bipolar transistor, wherein the diffusion is placed entirely in a tub to increase the breakdown voltage, is not appropriate for all applications either. Indeed, it has been seen that this structure provides a very high breakdown voltage, e.g., in the range of 40 to 100 volts. Certain applications require tight protection of the level of the high voltage transmitted to the pad, namely protection at a level that is just slightly higher than the transmitted voltage. For example, if the maximum level of the highest voltage transmitted to the pad is equal to 19 volts, it is sought to be able to activate the protection device at 20 volts at least.

Furthermore, a metal connection of the collector to the pad and the resistor must provide efficient protection. Indeed, the physical position at which the metal contact is made should not be capable of disrupting any junction other than the collector-base junction at which this disruption is desired.

None of the known structures of the related art can be used to resolve this problem.

This technical problem arises especially in integrated circuits including an EEPROM memory that uses an internally generated programming/erasure voltage on the order of 19 volts (with integrated load pump and multipliers) as shown schematically in FIG. 1. To enable the testing and characterizing of these memory circuits, there is provided a connection pad PS on which the high voltage level Vpp can be switched over to the output pad through a high voltage switch-over transistor (T1, COM).

SUMMARY OF THE INVENTION

The present invention proposes to resolve the technical problem referred to here above.

In the invention, a method is sought that makes it possible to have a protection device adapted to protect a high voltage transmission pad.

As characterized, the invention therefore relates to a method for the manufacture, in CMOS technology on a P-type substrate, of a structure for the protection of a connection pad against surge voltages or electrostatic discharges. The structure comprises a protection series resistor between the internal circuitry to be protected and said connection pad and a lateral bipolar transistor with a first N type diffusion and a second N type diffusion to form an emitter and a collector, the intermediate region forming the base of said transistor, and one of the diffusions being connected to said pad to be protected. According to the invention, this diffusion connected to the pad is made in an N type tub with a zone that extends laterally outside the tub in the base, a P-type implantation being made on the entire substrate outside the N type tub except in the region of the base of said lateral transistor in which said zone extends.

One embodiment is directed to a protection device to protect an integrated circuit in CMOS technology on a P-type substrate including a series protection resistor disposed between internal circuitry to be protected and a connection pad, a lateral bipolar transistor including a first N type diffusion to form an emitter of the lateral bipolar transistor, a second N type diffusion to form a collector of the lateral bipolar transistor and an intermediate region forming a base of said transistor. One of the N-type diffusions is connected to said connection pad and the N-type diffusion that is connected to the connection pad is made in an N-type tub with a zone that extends laterally outside the tub in the base. A P-type implantation is made on the entire substrate outside the N-type tub and not in the region of the base of said lateral transistor in which said zone does not extend.

Another embodiment is directed to a method of providing a circuit to protect against voltage surges in a substrate with the method comprising steps of weakly doping the substrate with impurities of a first type at a first doping level; depositing impurities of a second type at a first depth from a surface of the substrate and at a second doping level to create a tub area; depositing impurities of the second type at a second depth from the substrate surface and at a third doping level to create a collector area of a lateral transistor, the collector area deposited partly in the tub area and including a zone that extends laterally outside the tub area, the second depth being less than the first depth and the third doping level being greater than the second doping level; depositing impurities of the second type at a fourth doping level in the substrate surface to create an emitter area of the lateral transistor; providing a thick field oxide and a field implantation area between the collector area and the emitter area as a base area of the lateral transistor; and depositing impurities of the first type at a fifth doping level on the entire substrate outside the tub area and in the zone of the collector area that extends laterally outside the tub area but not in the base area where the lateral zone does not extend.

BRIEF DESCRIPTION OF THE DRAWINGS

Other features and advantages of the present invention are described in detail in the following description, given by way of an indication that in no way restricts the scope of the invention, and with reference to the appended drawings, of which.

DETAILED DESCRIPTION

Figure 1:
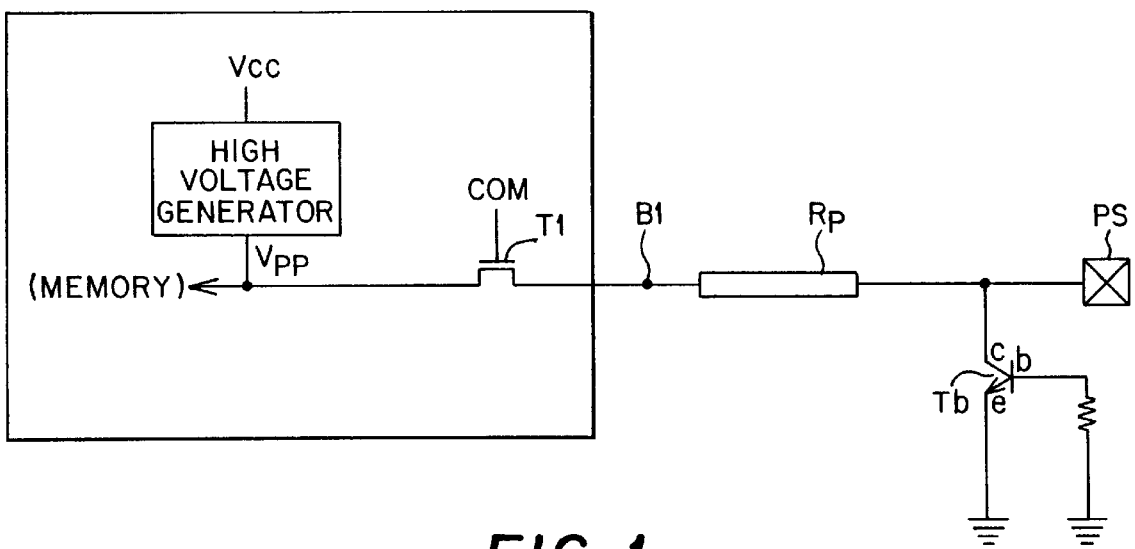
FIG. 1, already described, shows a diagram of a protection device with a series resistor and a lateral bipolar transistor for a connection pad receiving an internally generated high voltage.
Figure 2A:
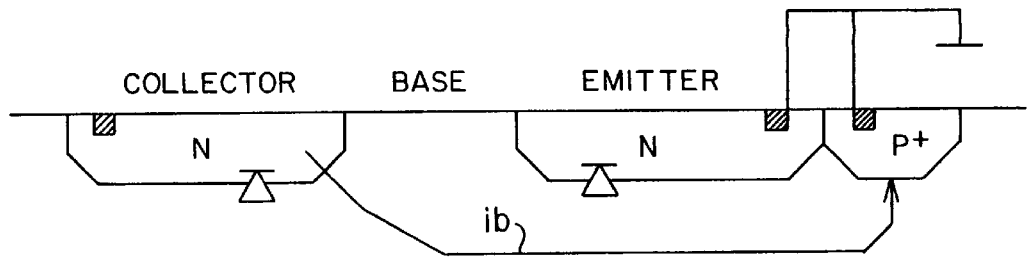
FIGS. 2a and 2b, already described, recall the mode of operation of a protection device of the type shown in FIG. 1.
Figure 2B:
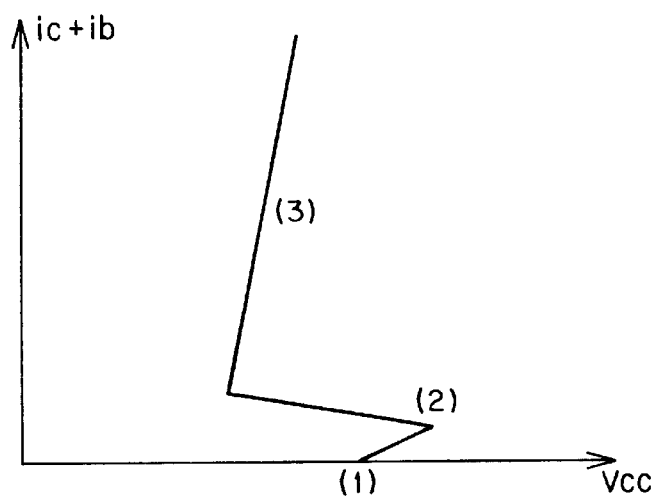
Figure 3A:
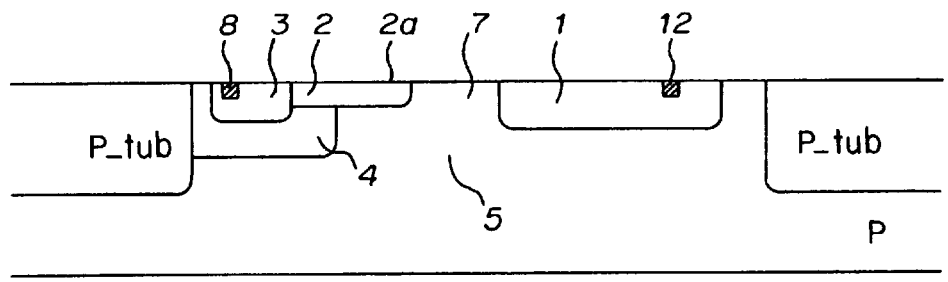
FIGS. 3a to 3c show an embodiment of the protection device according to the invention.

FIG. 3a shows a first sectional view of the protection device according to the invention, with a metal contact 8 of the connection pad PS on a collector and a metal contact 12 for the connection of an emitter to ground. The emitter is obtained by an N type diffusion 1. The collector comprises an N type diffusion 2 in an N type tub 4.

The emitter and the collector are separated conventionally by a base 5 of a lateral transistor in the P substrate. A thick field oxide and a field implantation Piso (an implantation of a thickness of about 0.5 microns) insulate the emitter and collector diffusion in a well-known way. With a view to the clarity of the drawings, this field oxide and the field insulation Piso have been shown in another figure, specifically, FIG. 6.

According to the present invention, the N type diffusion 2 is made with a zone 2a that extends laterally outside the tub 4, in the region of the base 5.

Figure 6:
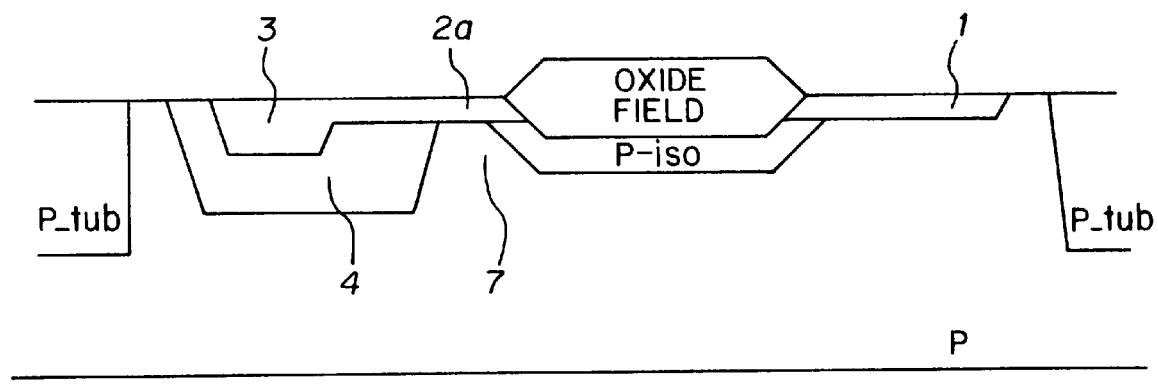
FIG. 6 shows a detailed view of the device with field oxide and field insulation referenced Piso.

Starting from a weakly doped P-type substrate, when an implantation of P-type impurities is made on the entire substrate outside the N type tub 4, but not in a region 7 of the base 5 in which the zone 2a of the diffusion 2 does not extend out of the N type tub 4, it is possible to adjust a breakdown voltage of the junction formed by the diffusion zone outside the tub 4 and the substrate. More precisely, this is the junction between the zone 2a and the field implantation Piso as shown in FIG. 6. In other words, the implantation of P-type impurities is made on the substrate including in the zone 2a but not in the N-type tub 4 nor in the region 7 which does not include the zone 2a. In FIGS. 3a and 6, the P-type implantation zones are referenced P-tub.

Figure 4A:
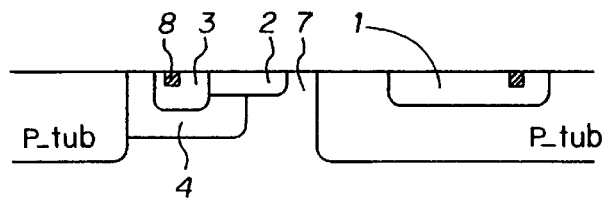
FIGS. 4a to 4c show alternative embodiments of the protection device according to the invention.

In FIGS. 3a and 6, it can be seen that the region 7 encompasses the entire base and the emitter. This makes it possible in practice to have a short base. In other words, it is possible to bring the emitter and the collector physically closer together. In order to adjust the breakdown voltage according to the invention, however, it is enough to have no P-type implantation in the region 7, just at the part of the diffusion 2 that extends outside the tub as can be seen, for example, in FIG. 4a. The fact is that, in this case, the base will be longer, giving rise to a loss of space in the integrated circuit. This also leads to a diminishing of the gain of the transistor, hence of its efficiency, i.e., the speed with which it goes into the saturation zone.

The breakdown voltage obtained according to the method of the present invention is on the order of 20 volts for technology using the following doping levels (in atoms/cm$^3$): $3\times10^{13}$ for the N diffusion, $5\times10^{15}$ for the substrate, $8\times10^{15}$ for the P implantation, and $1\times10^{16}$ for the Piso field implantation (see FIG. 6).

To make a metal contact 8 on the collector, for the connection to the pad PS that is to be protected and to the first terminal of the protection resistor Rp, a diffusion of N type impurities is made locally, i.e., in a zone 3 within a tub, to obtain sound behavior under voltage on the contact. Indeed, it should not be the junction at the resistor that breaks down. The tub therefore makes it possible, at the contact of the protection resistor Rp, to have a junction with a breakdown voltage in the range of 40 volts. This clearly provides for the desired protective function. With the method according to the present invention, there is therefore available a protection device capable of efficiently protecting a pad PS designed to transmit voltages ranging, for example, up to 19 volts. As soon as the level on the pad reaches, for example, 19.7 volts, the protection by collector-base breakdown in the zones 2a and Piso starts functioning, with the junction between the N+ zone and N tub zones 3 and 4 beneath the metal contact having, for its part, a breakdown voltage that is higher.

The zone with higher doping 3 is obtained in a standard way in two steps. In the first step, the first N type diffusion is made. Then a part of this diffusion is masked before reiterating the operation to obtain the diffusion zone 3 with higher doping and the zone 2 with lower doping, which was masked during the second diffusion operation.

Figure 3B:
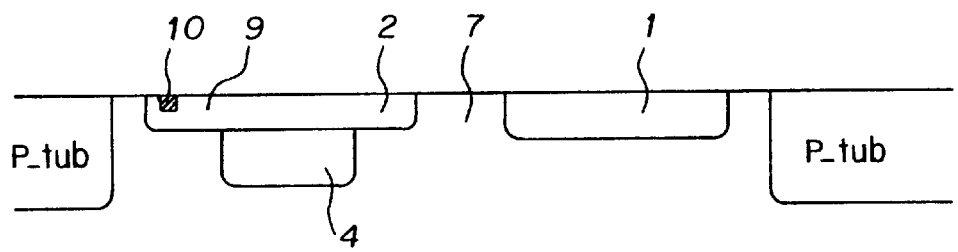

FIG. 3b shows a sectional view of the contact for an other terminal B 1 of the series resistor Rp.

In the example shown, a region 9 of the diffusion zone 2 is made outside the tub 4, opposite the base, and in a region of the substrate in which no P-type implantation has been made. The zones in which the P-type implantation is made are referenced P-tub. The metal contact 10 is made on this zone 9. Since here it is the contact of the terminal B1, upline with respect to the protection device, the contact must be just capable of taking the voltage level to be transmitted to the connection pad PS.

Figure 3C:
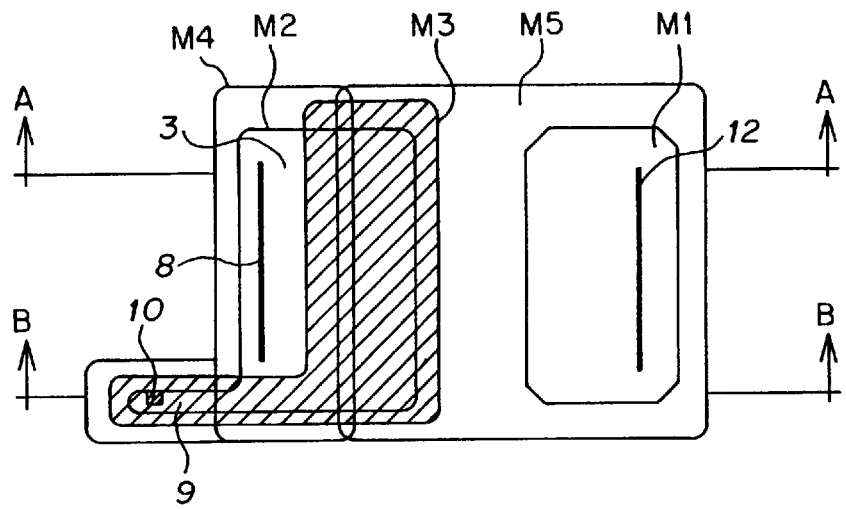

The pattern of the masks corresponding to the section AA of FIG. 3a and to the section BB of FIG. 3b is shown in FIG. 3c. This figure shows the mask for the N type diffusion with a mask M1 for the emitter, a mask M2 for the first operation of diffusion of the collector and a mask M3 to make the second diffusion. The masks M1 and M2 are positive masks: it is the external part that is the concealed zone, while the mask M3 is a negative mask whose internal part, which is shaded in the figure, is the concealed part. Combined with the mask M2, it determines the zone 3. It is possible, in these figures, to see the mask M4 (positive) for the tub 8 and the mask M5 (negative) which, when combined with the mask M4, determines the zones in which the P-type implantation is not made.

Figure 4B:
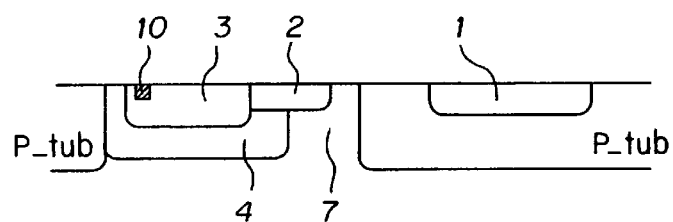
Figure 5:
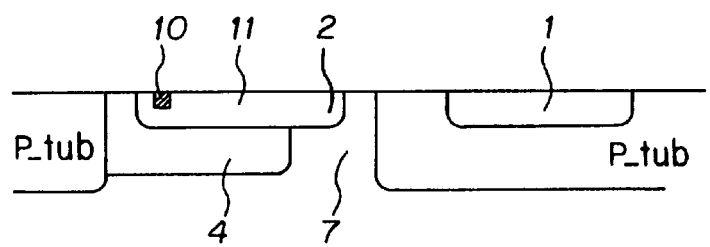
FIG. 5 shows another alternative embodiment of the protection device according to the invention.

The contact of the second terminal of the resistor can be made in other ways, as shown in FIGS. 4b and 5.

The variant shown in FIG. 5 consists of making the contact 10 on the diffusion 2 of the collector, in a zone 11 included in the N-type tub 4.

Another variant shown in FIG. 4b consists of making the contact 8 of the pad to be protected and the contact 10 on the same overdoped zone 3 of the collector that is included in the tub 4.

Figure 4C:
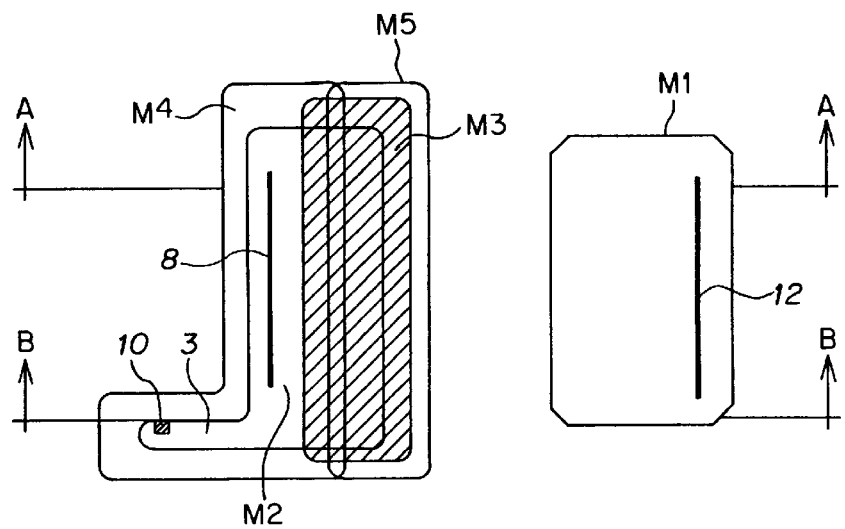

The drawings of the masks corresponding to the variants of the sectional views 4a and 4b are shown in FIG. 4c.

Furthermore, the method described for the collector is equally well applicable to the emitter when it is the latter that is connected to the pad to be protected.

All these variants and the minor modifications that may result therefrom come within the field of the invention.

Having thus described certain embodiments of the invention, modifications thereof will be readily apparent to those skilled in the art which are intended to be included in the following claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A protection device to protect an integrated circuit in CMOS technology on a P-type substrate, the protection device comprising:

a series protection resistor disposed between internal circuitry to be protected and a connection pad;

a lateral bipolar transistor including a first N-type diffusion to form an emitter of the lateral bipolar transistor, a second N-type diffusion to form a collector of the lateral bipolar transistor and an intermediate P-type region forming a base of said transistor;

wherein one of the N-type diffusions is connected to said connection pad;

wherein the N-type diffusion that is connected to the connection pad is made in an N-type tub with a zone that extends laterally outside the tub in the base; and wherein a P-type implantation is made on the entire substrate outside the N-type tub and not in the intermediate region of the base of said lateral transistor in which said zone does not extend.

2. The protection device as recited in claim 1, wherein: the first N-type diffusion is connected to the connection pad.

3. The protection device as recited in claim 1, wherein: the second N-type diffusion is connected to the connection pad.

4. The protection device as recited in claim 1, wherein:

the first and second N-type diffusions each have a doping level of about $3 \times 10^{13}$ atoms/cm$^3$;

the P-type substrate has a doping level of about $5 \times 10^{15}$ atoms/cm$^3$;

the intermediate P-type region has a doping level of about $1 \times 10^{16}$ atoms/cm$^3$; and the P-type impurities implanted on the entire substrate outside the N-type tub and not in the intermediate region of the base of said lateral transistor in which said zone does not extend have a doping level of about $8 \times 10^{15}$ atoms/cm$^3$.

5. A circuit structure for protecting internal circuitry against voltage surges present on a connection pad, the structure comprising:

a P-type substrate;

a lateral transistor disposed in the P-type substrate, the lateral transistor comprising a first N-type diffusion to form an emitter, a second N-type diffusion in an N-type tub to form a collector and a thick field oxide and a field implantation coupled together to form a base;

wherein the second N-type diffusion comprises a zone that extends laterally outside the N-type tub and into a region of the base; and wherein P-type impurities have been implanted on the P-type substrate outside the N-type tub and implanted in the zone of the second N-type diffusion that extends laterally outside the N-type tub and not implanted in the region of the base into which the lateral zone does not extend.

6. The circuit structure as recited in claim 5, wherein:

the first and second N-type diffusions each have a doping level of about $3 \times 10^{13}$ atoms/cm$^3$;

the P-type substrate has a doping level of about $5 \times 10^{15}$ atoms/cm$^3$;

the base field implantation has a doping level of about $1 \times 10^{16}$ atoms/cm$^3$; and the P-type impurities implanted on the P-type substrate outside the N-type tub and implanted in the zone of the second N-type diffusion that extends laterally outside the N-type tub have a doping level of about $8 \times 10^{15}$ atoms/cm$^3$.

7. The circuit structure as recited in claim 5, further comprising:

a third diffusion of N-type impurities deposited locally in a zone within the N-type tub; and a first metal contact disposed on the third diffusion of N-type impurities.

8. The circuit structure as recited in claim 7, further comprising:

a fourth diffusion of N-type impurities deposited in a region of the second N-type diffusion outside the N-type tub, opposite the base and in a region of the substrate in which no P-type implantation has been made; and a second metal contact disposed on the fourth diffusion of N-type impurities.

* * * * *